(12) United States Patent
Lee et al.

(10) Patent No.: US 7,037,792 B2
(45) Date of Patent: May 2, 2006

(54) FORMATION OF REMOVABLE SHROUD BY ANISOTROPIC PLASMA ETCH

(75) Inventors: John Lee, Cupertino, CA (US); Barbara A. Haselden, Cupertino, CA (US)

(73) Assignee: ProMOS Technologies, Inc., Hsin Chu (TW)

( * ) Notice: Subject to any disclaimer, the term of this patent is extended or adjusted under 35 U.S.C. 154(b) by 48 days.

(21) Appl. No.: 10/877,591

(22) Filed: Jun. 25, 2004

(65) Prior Publication Data
US 2005/0287762 A1    Dec. 29, 2005

(51) Int. Cl.
*H01L 21/336* (2006.01)
(52) U.S. Cl. ...................... 438/296; 438/297
(58) Field of Classification Search ............ None
See application file for complete search history.

(56) References Cited
U.S. PATENT DOCUMENTS 6,060,371 A * 5/2000 Shinmura .................. 438/424
6,337,262 B1 * 1/2002 Pradeep et al. ............. 438/574
6,933,240 B1 * 8/2005 Lazar et al. ................. 438/710

* cited by examiner

Primary Examiner—Luan Thai
(74) Attorney, Agent, or Firm—MacPherson Kwok Chen & Heid LLP; David S. Park

(57) ABSTRACT

Isotropic etching of sacrificial oxide that is adjacent to a trench fill step in an STI wafer can lead to undesired etching away of a sidewall of the trench fill material (e.g., HDP oxide). A sidewall protecting method conformably coats the trench fill step and sacrificial oxide with an etch-resistant carbohydrate. In one embodiment, conforming ARC fluid is spun-on and hardened. A selective, dry plasma etches the hardened ARC over the sacrificial oxide while leaving intact part of the ARC that adheres to the trench fill sidewall. The remnant sidewall material defines a protective shroud which delays the subsequent isotropic etchant (e.g., wet HF solution) from immediately reaching the sidewall of the trench fill material. The delay length of the shroud can be controlled by tuning the etchback recipe. In one embodiment, the percent oxygen in an $O_2$ plus $Cl_2$ plasma and/or bias power during the plasma etch is used as a tuning parameter.

27 Claims, 7 Drawing Sheets

301 ARC DEPOSIT & CURE

302 ARC ETCHBACK

Cl₂ + O₂ Plasma 370

FIG. 3A

FORMATION OF REMOVABLE SHROUD BY ANISOTROPIC PLASMA ETCH

BACKGROUND

1. Field of Disclosure

The present disclosure of invention relates generally to the manufacture of trench-isolated semiconductor devices such as DRAM cells which may be provided in a memory integrated circuit.

The disclosure relates more specifically to certain manufacturing steps by which a juncture between trench isolation and active semiconductor may be prevented from grooving due to an isotropic etch process.

2. Description of Related Art

So-called shallow trench isolation (STI) has come into common usage for providing electrical isolation between transistors and/or other active devices of a monolithically integrated circuit. STI is particularly useful in situations where low current leakage is important such as in the fabrication of dynamic random access memory (DRAM) devices.

The basic STI process often starts with a monocrystalline semiconductor wafer (e.g., silicon). Pad oxide and silicon nitride layers are usually formed on top of the starting wafer in the recited order. These sacrificial layers will later be used for chemical mechanical planarization (CMP). After the silicon nitride has been deposited, the wafer is masked and selectively etched to form substantially vertical trenches in places where isolation oxide is to be formed. Some sidewall tapering and corner rounding may be provided. Typically, a thin layer of so-called, liner oxide is thermally grown along the interior surfaces of the trenches before a less dense form of oxide is deposited by CVD (chemical vapor deposition) to fill the bulk volumes of the trenches. Those skilled in the art understand that certain forms of silicon dioxide, namely those which are thermally grown from a monocrystalline starting substrate, tend to have relatively high density and excellent insulation characteristics. On the other hand, CVD-deposited oxides tend to be less dense and to have comparably poorer insulation characteristics. However, the CVD-deposited oxides can be formed more quickly and at lower cost, and they usually do not stress the crystal lattice structures of adjacent semiconductor material as much as would an equal volume of thermally-grown oxide. Thus, there are advantages to filling the bulk of the isolation trenches with CVD oxide.

There are different kinds of CVD oxide, including but not limited to: AP-CVD (ozone/TEOS), LP-CVD TEOS, SA-CVD, and HDP-CVD (High Density Plasma). These techniques may be used with the present invention, although not necessarily with equivalent results for each. HDP-CVD may often be used to form a more dense type of CVD oxide than the other kinds of CVD processes and it is therefore used extensively in industry.

After the CVD-based trench fill operation has been completed, the basic STI method typically continues with the provision of CMP for planarization of the wafer. The earlier formed silicon nitride often serves as a selective stop layer for the CMP process. A first wet etch (e.g., with hydrofluoric acid (HF)) is then applied to remove both of the silicon nitride layer and the underlying pad oxide layer and to thereby expose the semiconductor substrate material beneath them. A sacrificial oxide layer is then thermally grown on the exposed silicon. The thermal process creates regions of annealed crystal beneath the sacrificial oxide. Later, these annealed crystal regions will be used to form critical parts of the active devices of the monolithically integrated circuit that is being fabricated, such as the source, drain, channel, and gate oxide regions of subsequently fabricated metal oxide semiconductor field effect transistors (MOSFETs). The positioning and contouring of each of the annealed crystal regions relative to its surrounding trench oxide (planarized by CMP) will often determine how well a later-formed, gate electrode contours relative to the planarized tops and sidewalls of the trench oxide.

Those skilled in the art can appreciate that both the integrity of the trench oxide sidewalls and the quality, the vertical positioning, and the contouring of the annealed crystal region relative to the trench oxide can later play crucial roles in determining how the active devices of the wafer later behave and how much power they dissipate in different states. Prior to forming the gates, the sacrificial oxide layer that has formed above the annealed crystal region must be removed. Removal is not a trivial problem. Different kinds of oxide respond to different kinds of oxide etch processes in different ways. More specifically, the less dense oxide (e.g., HDP-CVD oxide) which often fills the bulk of the trench tends to etch more quickly than does the thermally-grown, and thus denser, sacrificial oxide. The differential in etch rates can produce undesired surface contours, including a problematic isolation-corner groove or crevice as shall be detailed below. Reliable and uniform methods are needed for reducing the undesirable effects of such differentials in etch rates which can cause grooving and associated problems.

SUMMARY

The present invention provides a method for forming removable shrouds by means of anisotropic plasma etch to thereby protect sidewalls of isolation dielectrics from grooving.

In accordance with one embodiment of the present invention, a method of manufacturing a semiconductor device is disclosed, including: providing a silicon oxide layer over a substrate; providing a trench in the substrate, an intersection of the trench and the surface of the substrate forming a corner; providing a dielectric that fills the trench to a level above the silicon oxide layer; providing an anti-reflective coating (ARC) layer conformally over the dielectric and the silicon oxide layer; and etching the ARC layer with a plasma including $O_2$ and $Cl_2$ to form an ARC shroud aligned with a sidewall of the dielectric, the ARC shroud protecting the dielectric from loss proximate the corner during a subsequent wet etch.

In accordance with another embodiment of the present invention, a method of manufacturing a semiconductor device is disclosed, further comprising: etching the ARC layer with a plasma including $O_2$ and $Cl_2$ to form an ARC shroud aligned with a sidewall of the dielectric and a portion of the silicon oxide layer; etching the silicon oxide layer with a wet etchant, the ARC shroud protecting the dielectric from loss proximate the corner during the wet etch; removing the ARC shroud; providing a gate oxide substantially over the substrate where the silicon oxide layer was previously provided; and providing a gate electrode over the gate oxide.

In accordance with yet another embodiment of the present invention, a method of manufacturing a semiconductor device is disclosed, further comprising: providing an anti-reflective coating (ARC) layer conformally over the dielectric and the silicon oxide layer; and etching the ARC layer with a plasma including a preselected ratio of $O_2$ to $Cl_2$ at a preselected bias power to form an ARC shroud aligned with a sidewall of the dielectric, the ARC shroud protecting the dielectric from loss proximate the corner during a subsequent wet etch.

These and other features and advantages of the present invention will be more readily apparent from the detailed description of the embodiments set forth below taken in conjunction with the accompanying drawings.

BRIEF DESCRIPTION OF THE DRAWINGS

The below detailed description section makes reference to the accompanying drawings, in which:

FIG. 3A is a schematic cross sectional view of a state in the fabrication of an STI structure showing an etch of a deposited ARC layer in accordance with the disclosure;

DETAILED DESCRIPTION

Figure 1A:
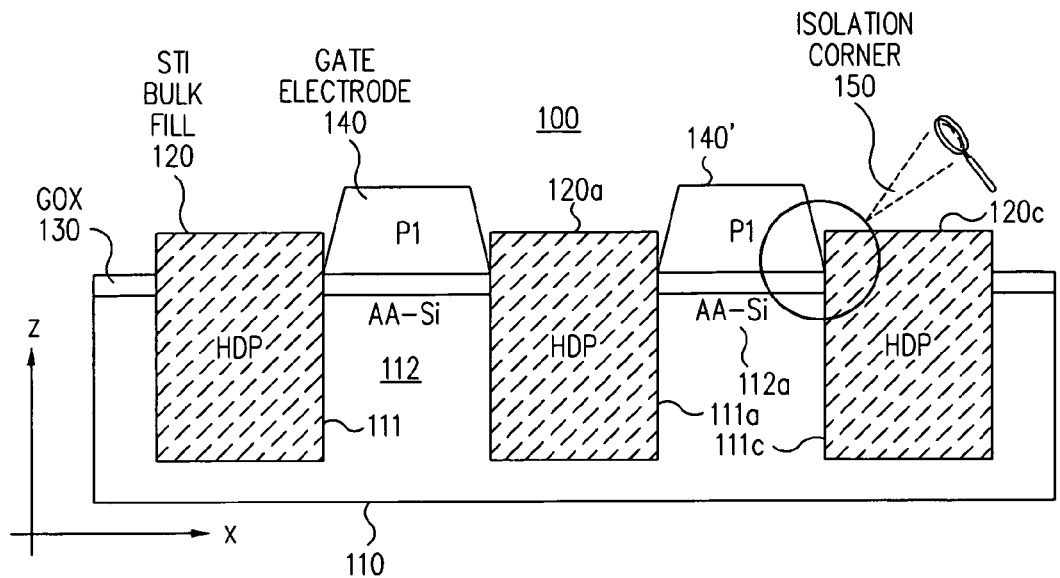
FIG. 1A is a schematic cross sectional view of an example of a STI scheme which includes an isolation corner where problems can develop.

FIG. 1A is a schematic cross sectional view of a monolithically integrated circuit 100 which relies on STI (where the reliance is at least partial) to provide electrical isolation between active devices. More specifically, a substrate 110 composed of, for example, monocrystalline silicon, has a plurality of spaced-apart isolation trenches 111 formed therein to define gaps between active area mesas 112. So-called active area regions (AA) 112$a$ at the top of the mesas are often used to define critical parts of active devices such as MOSFETs.

The isolation trenches are typically filled with a bulk insulative material 120 such as HDP-oxide. A gate oxide layer (GOX) 130 is provided on the AA regions 112$a$ so as to abut against the sidewalls of the oxide in the surrounding trenches 111. Gate electrodes such as ones composed of conductive polysilicon (e.g., P1 electrode 140) are provided on the GOX 130. Edges of these gate electrodes 140, 140' may also abut against the sidewalls of the oxide in the surrounding trenches 111. Each gate electrode may cooperate with its underlying portion of GOX 130 and doped regions (not shown) of the underlying AA (e.g., 112$a$) to define a respective MOSFET (see e.g., 114–116 of FIG. 1B).

The oxide-filled trenches 111 are often called upon to provide electrical isolation not only between different active devices, but also between different parts of each active device (e.g., each MOSFET). More specifically, even though it appears in FIG. 1A that HDP-oxide filled trench 111$a$ merely separates gate electrode 140 from gate electrode 140', the HDP-oxide material 120$a$ of trench 111$a$ is typically called upon to do much more. Designers of the integrated circuit may expect the HDP-oxide material 120$a$ to cooperate in accurately defining the effective channel width of the AA region 112$a$, where definition of this critical dimension (CD) is essentially uniform not only across each wafer, but also from one mass-produced wafer to the next. The trench fill 120$a$ may be further used to accurately define the contour of the gate electrode and to define the distribution of electric field flux through GOX 130.

Highlighted in FIG. 1A is an isolation corner 150, which is a specific portion of the trench-filling HDP-oxide material (e.g., 120$c$) that is critical in providing one or more of these device-performance defining aspects. Isolation corner 150 includes the area where the GOX 130 and/or gate electrode 140' come to abut against the oxide material 120$c$ of the adjacent isolation trench 111$c$.

Figure 1B:
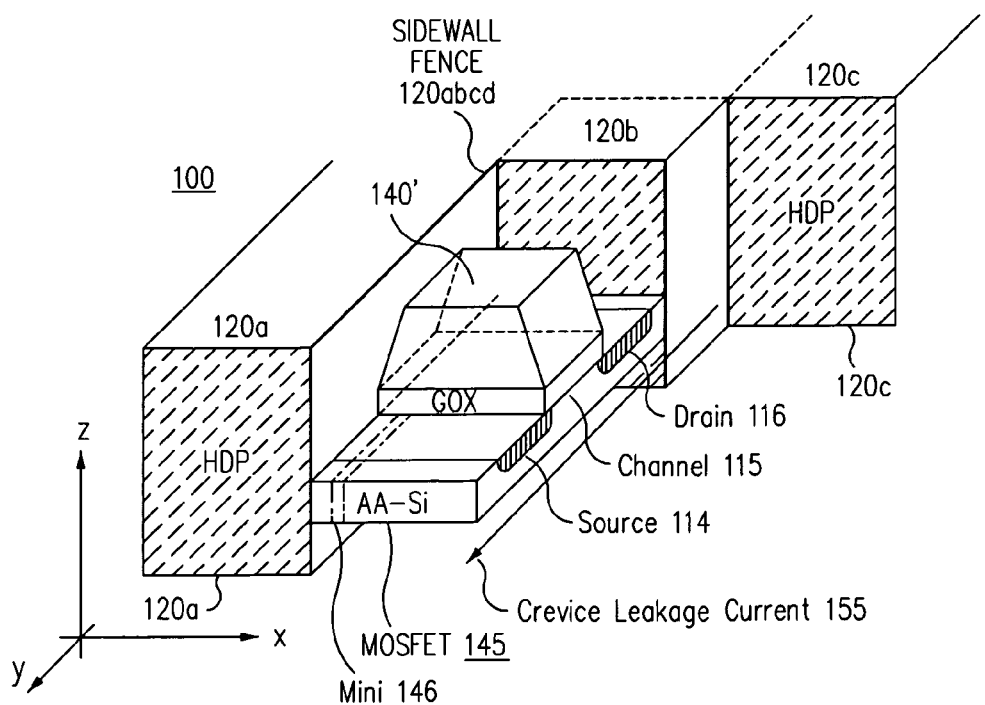
FIG. 1B is a sectional perspective view showing an example of a MOSFET fit inside an STI sidewall fence and undesirable leakage current.

A perspective view is provided in FIG. 1B for giving additional insight. Here, the schematic representation of HDP-oxide section 120$c$ is pushed or cut back to reveal the source 114, drain 116, and channel 115 regions of a MOSFET 145 that further includes gate electrode 140'. HDP-oxide sections 120$a$ and 120$b$ may be viewed as defining two parts of a four-walled fence (referenced as 120-$a$-$b$-$c$-$d$) that surrounds the rectangularly-shaped MOSFET 145 on all four sides. The MOSFET 145 may be seen electrically as constituting a plurality of many parallel, mini-MOSFETs, with each of the latter being a slice that extends in a plane parallel to the ZY plane. Each such slice has a different X coordinate value. The mini-MOSFETs which occupy the isolation corner region 150 can have electrical characteristics different from those mini-MOSFETs (e.g., 146) which are formed more closely to the center of the overall MOSFET device 145. More specifically, an undesirable crevice leakage current 155 may flow through the mini-MOSFETs of the isolation corner region 150 (see briefly FIG. 1A) if there is a defect and/or deformity in the oxide material 120$c$ that fills the adjacent isolation trench 111$c$. Those skilled in the art may sometimes refer to this crevice leakage current 155 as a subthreshold leakage characteristic of the overall MOSFET 145. The crevice leakage current 155 is often undesirable, particularly when its magnitude varies across each of mass-produced wafers or as between one such wafer and the next. It will now be explained how such a crevice leakage current 155 may develop in mass-produced wafers.

Figure 2A:
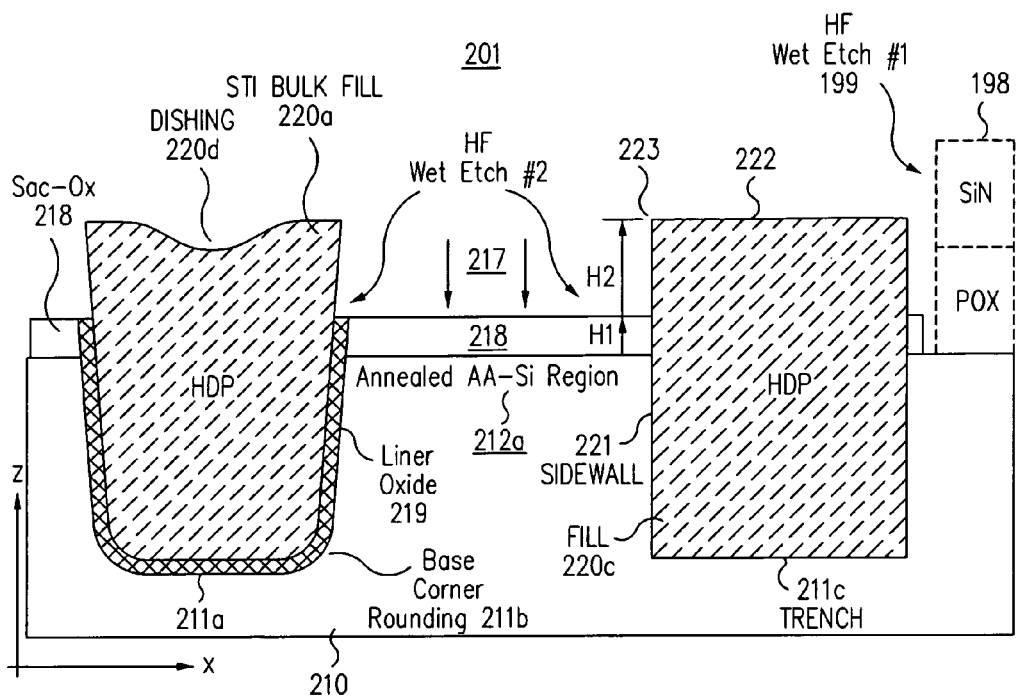
FIG. 2A is a schematic cross sectional view of a state in fabrication of an STI structure showing the start of isotropic etching of a sacrificial oxide layer.

FIG. 2A provides a cross sectional view showing how unwanted defects and/or deformities may develop in the sidewall oxide material of fence 120-*a*-*b*-*c*-*d* (FIG. 1B). Subsequent diagrams show how this can lead to the undesired crevice leakage current 155 (FIG. 1B). More specifically, FIG. 2A shows a state 201 in a sequence of states that occur during the fabrication of an STI structure. In this state 201, it is desired to etch away a sacrificial oxide layer 218.

A tapered trench 211*a* on the left side of FIG. 2A is shown to include in one embodiment a thermally-grown, trench liner oxide 219 disposed in the interior surface of the trench. The tapered contour of trench 211*a* is further shown to include a rounded base corner 211*b*. These features are not to scale. Typically the trench liner oxide 219 is extremely thin and defines a very minute portion of the trench-filling oxide. It is also noted that the taper of the trench sidewalls can be relatively slight. HDP-oxide material 220*a* fills the bulk and may include slight dishing 220*d* from a CMP step.

A trench 211*c* on the right side of FIG. 2A is drawn more simplistically to not include features such as liner oxide, corner rounding, trench tapering, and CMP dishing. Trench 211*c* is idealistically shown to have a substantially rectangular profile. The filling HDP-oxide material 220*c* is similarly shown to have a substantially rectangular profile, including a substantially vertical sidewall 221 and a substantially horizontal top surface 222. Planar surfaces 221 and 222 are shown to meet at a substantially square angle corner 223. It is to be understood however that the present disclosure contemplates more complex geometric organizations in state 201. The removal of sacrificial oxide 218 is intended to be a transparent step that removes only the sacrificial oxide and is not intended to change the geometric organization and/or relationships of the other components.

As further background reference, it is shown in FIG. 2A that sacrificial pad oxide (POX) and silicon nitride (SiN) had been previously present features 198, and that a first wet etch 199 had been used to remove those sacrificial features. Prior to removal of features 198, CMP had been performed to planarize the top surfaces, (e.g., 222) of the HDP-oxide fills, 220*a* and 220*c*. A slight step remains between the AA silicon region and the tops 222 of the HDP-oxide fills, 220*a* and 220*c*. The post-CMP silicon has been annealed and the annealing process produced a thin sacrificial oxide layer 218 having a respective first thickness or height, H1 (e.g., about 200 Å) over the annealed AA region 212*a*. A further step height H2 (e.g., about 700 Å–800 Å) separates the top of sacrificial oxide layer 218 from the tops 222 of the HDP-oxide fills, 220*a* and 220*c*.

Referring again to FIG. 2A, a second wet etch 217 is performed to remove the sacrificial oxide 218. In one embodiment, a diluted 1:100 HF wet etch bath is applied for about 10–15 seconds and is followed by an etch stopping rinse dump. The HF exposure time is empirically selected to etch completely through the thickness H1 of the sacrificial oxide 218.

Figure 2B:
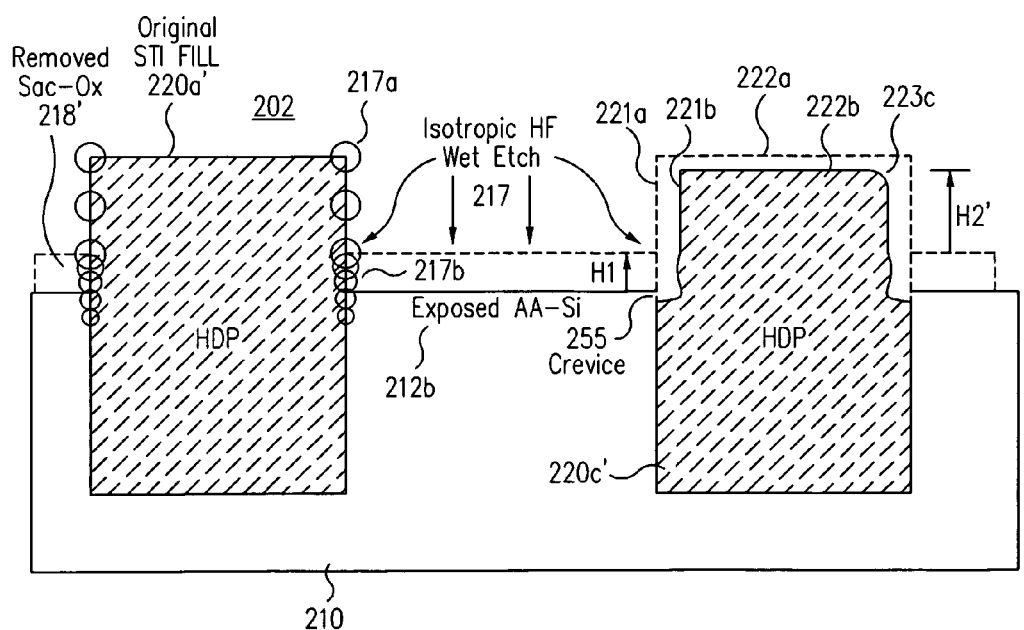
FIG. 2B is a schematic cross sectional view of a subsequent state in the fabrication of the STI structure showing how the isotropic etch can produce an undesirable crevice in the STI sidewall fence and/or rounding at the top edges of the STI sidewall fence.

FIG. 2B illustrates the possible defects that can occur during this etch, such as grooving in the HDP-oxide fill 220*c*. The HF bath indiscriminately and isotropically etches through exposed oxide surfaces, including through isolation corner areas of the HDP-oxide sidewalls as these become time-wise exposed. As time progresses, more of the sacrificial oxide 218 is eaten away, and more of the HDP sidewalls is exposed. This creeping exposure process is represented at 217*b*. Symbol 217*a* contrastingly shows a two-faced attack that the HF bath can make on the exposed sidewalls and top surfaces (221–222) at the top right corner of HDP-oxide fill section 220*a*.

Oxide fill 220*c*' on the right side of FIG. 2B shows an example of the oxide profiles after the wet etch. The H1 thickness of the sacrificial oxide layer 218' has been etched away by the acid bath. At the same time, the vertical sidewall (221 in FIG. 2A) of HDP-oxide fill section 220*c*' has eroded back from contour 221*a* to recessed contour 221*b*. The horizontal top surface of HDP-oxide fill section 220*c*' has eroded down from contour 222*a* to recessed contour 222*b*. The sharp corners at the tops of the HDP-oxide fill 220*c* have eroded to become rounded corners as is represented at 223*c* in FIG. 2B.

Moreover, an undesirable crevice or groove 255 is shown to have formed in the isolation corner area between the silicon material of the exposed AA region 212*b* and the HDP-oxide fill section 220*c*'. Because silicon is not attacked by HF as easily as are oxides, FIG. 2B schematically assumes that the erosion of the silicon material has been negligible in comparison to the HDP oxide erosion which created crevice 255. The downwardly-directed acid-induced erosion in the isolation corner area may be referred to as "pitting", "grooving", "crack formation", or other such terms instead of as crevice formation. The erosion can be non-uniform in nature. Acid-created crack(s) between the silicon mesa and the HDP-oxide of fill 220*c*' may be of relatively long lengths, and/or of odd shapes, and they may be so narrow that they are difficult to detect with an ordinary scanning electron microscope (SEM). The drawn crevice 255 is merely representative of such cracks.

Figure 2C:
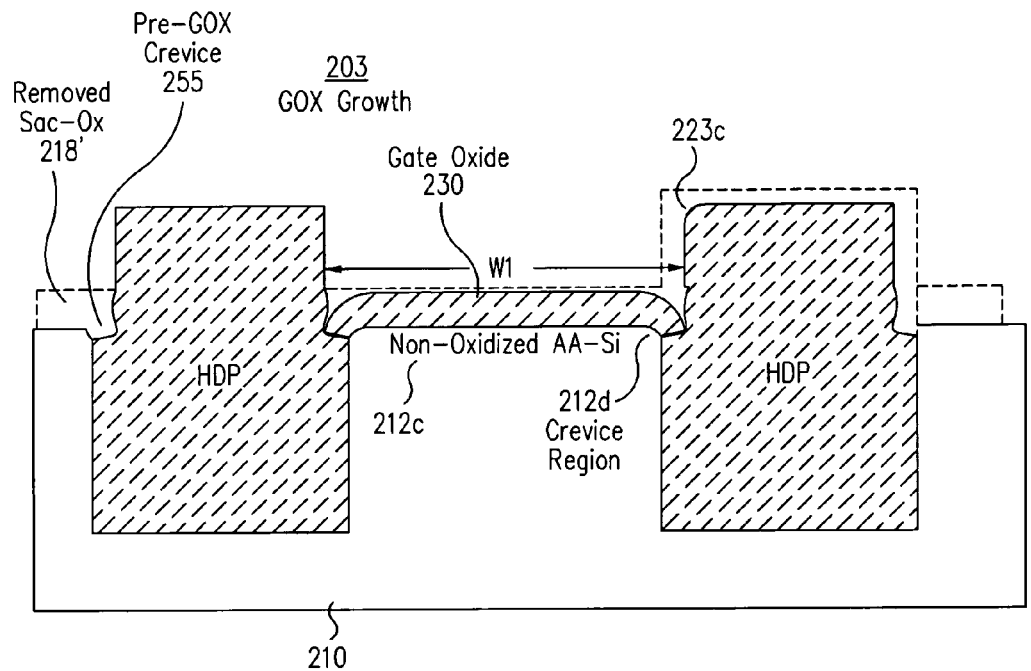
FIG. 2C is a schematic cross sectional view of a state in the fabrication of the STI structure showing how the sidewall crevice can alter the contour of subsequently grown gate oxide and/or lattice stresses in the underlying semiconductor material.

In a subsequent state 203, shown in FIG. 2C, gate oxide 230 has been thermally-grown from the exposed silicon 212*b* of FIG. 2B. Non-oxidized silicon 212*c* remains directly below the gate oxide 230. As shown, the gate oxide 230 may bend downwardly into the crevice region 212*d* and may be squeezed between the HDP sidewall and the adjacent semiconductor material. Typically, it is desirable to form the gate oxide to have an essentially planar and low-stress structure. However, due to the presence of the undesired crevice 255, the gate oxide 230 can take on dimensions (e.g., lateral width W1) and/or shapes (e.g., concave down) other than those desired. The underlying, active region of non-oxidized silicon 212*c* can also take on dimensions (e.g., effective channel width) and/or shapes other than those intended or desired. Undesired stresses may develop inside the thermally-grown oxide 230 and/or between the thermally-grown oxide 230 and the crystal lattice of the non-oxidized AA silicon region 212*c* in the region 212*d* where the gate oxide enters the crevice. Undesired electric field concentrations may develop in the area around crevice region 212*d*. The extent to which such undesired characteristics develop is determined by the extent and directions in which the crevice 255 formed in the post-wet etch state 202 of FIG. 2B. Since crevice formation can vary from wafer to wafer and/or across the extent of each wafer, undesirable mass-production variances may also be introduced.

Figure 2D:
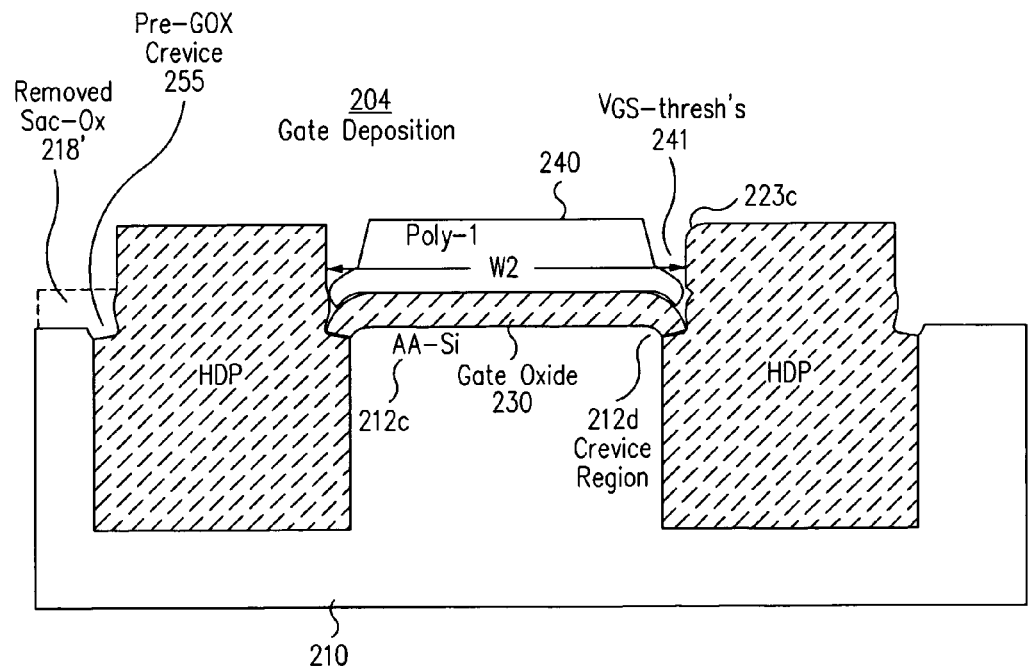
FIG. 2D is a schematic cross sectional view of a state in the fabrication of the STI structure showing how the sidewall crevice can alter the contour and electrical field environment of a subsequently formed gate electrode.

In a subsequent state 204 depicted in FIG. 2D, polysilicon or other gate-defining material 240 has been deposited via CVD or otherwise over the gate oxide 230. The contour, shape, and/or relative positioning of the gate electrode material 240 and stresses thereon can vary depending on the formation of crevice 255 and the subsequent formation of gate oxide 230. More specifically, the effective lateral width W2 of the gate electrode 240, the effective leakage current gate-to-source voltage thresholds ($V_{GS-thresh}$'s 241) of respective transistors, and/or the effective electrical field flux distributions around the regions of the gate electrode 240 and the gate oxide 230 can vary from wafer to wafer in a mass-production situation (or across the many dice of each wafer) when the shape and size of the crevice 255 varies from wafer to wafer (and/or varies across the many dice of each wafer). Such variations can lead to undesirable and/or unpredictable behavior by the electrical circuits of the fabricated wafer. Thus, crevices 255 can lead to undesirable results. Accordingly, it would be advantageous if these effects could be reduced or essentially eliminated in a substantially uniform manner on a wafer to wafer basis and/or across the many dice of each wafer.

Figure 3B:
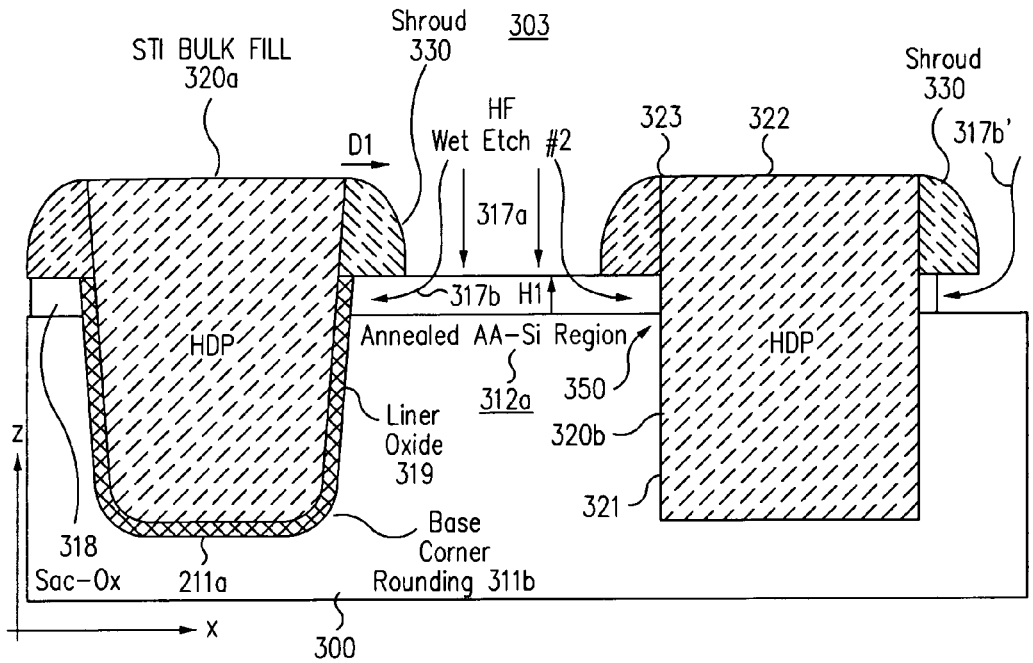
FIG. 3B is a schematic cross sectional view of a state in the fabrication of the STI structure in accordance with the disclosure, showing the start of isotropic etching of a sacrificial oxide layer where etch-resistant shrouds are provided to protect the isolation corners.

FIGS. 3A–3E illustrate a process sequence utilizing a method in accordance with the disclosure to form isolation structures with substantially vertical sidewalls. FIG. 3A schematically shows a cross sectional view of a first state 301 in the fabrication of a shroud-protected monolithically integrated structure 300 in accordance with the disclosure. More specifically, a viscous organic fluid such as that used for spin-on deposition of an anti-reflection coating (ARC) has been deposited at or near the center of the wafer in accordance with the disclosure. An example of an applicable ARC that may be used in accordance with the present disclosure is found in U.S. patent application Ser. No. 10/757,144, filed Jan. 9, 2001 by William Roberts et al., published Feb. 7, 2002 and entitled, "Anti-Reflective Coating Conformality Control", which is incorporated by reference herein for all purposes. Puddling time was used to determine the viscosity of the material prior to spinning. Temperature control and/or the addition or evaporation of various solvents may be alternatively or additionally used for controlling viscosity and surface tension effects. The specific controls for viscosity, surface tension, and spin-on thickness may be empirically established in view of the following, further description.

After the pre-spin viscosity characteristics of the fluid ARC material are established, the wafer is spun at appropriate speed to thereby cause the viscous liquid to spread uniformly and conformably across the wafer. The distributed ARC fluid is then cured (hardened) to provide a conformal ARC layer 360 in accordance with the further discussion below. It is to be understood however, that the described spin-on coating and hardening of the shroud material is not the only way that the desired shaping of the shrouds may be obtained. Other methods for conformably depositing the shroud material (e.g., vapor deposition) may be used. Furthermore, the shroud material does not have to be composed of a light absorbing material.

Those skilled in the art of depositing organic ARC material will understand that different ARC formulations may be used and that the selected ARC fluid may be adapted for providing either a substantially planar top surface or a nonplanar top surface, where the formed ARC layer conformingly follows the contour of the substrate surface. When ARC is conventionally used for providing an anti-reflective function in a photolithographic step, the amount of material deposited at the center of the wafer is usually set to be either a fairly large amount for providing a planarized top surface for the hardened ARC layer; or the amount of material deposited at the center of the wafer is set to be a relatively small amount so that a very thin and very conforming layer of hardened ARC will coat the underlying substrate surface. After this, a coating of photoresist material (PR) is deposited on the ARC such that the PR will have a substantially planar top surface 380.

In accordance with one embodiment of the present disclosure however, photoresist material 380 is not coated over the ARC layer 360. Moreover, even though a conformably coating formulation is chosen for the ARC liquid, a greater than conventional thickness is sought. In accordance with the particular illustrated embodiment 301 of FIG. 3A, a greater than conventional amount of ARC fluid (polymer plus binder plus solvent) may be placed at the wafer center and can be puddled to a greater than conventional viscosity so that after hardening of the spun-on ARC (e.g., by heat and solvent evaporation), the deposition-and-cure step 301 produces a hardened conformal ARC layer 360, as illustrated in FIG. 3A.

Figure 3C:
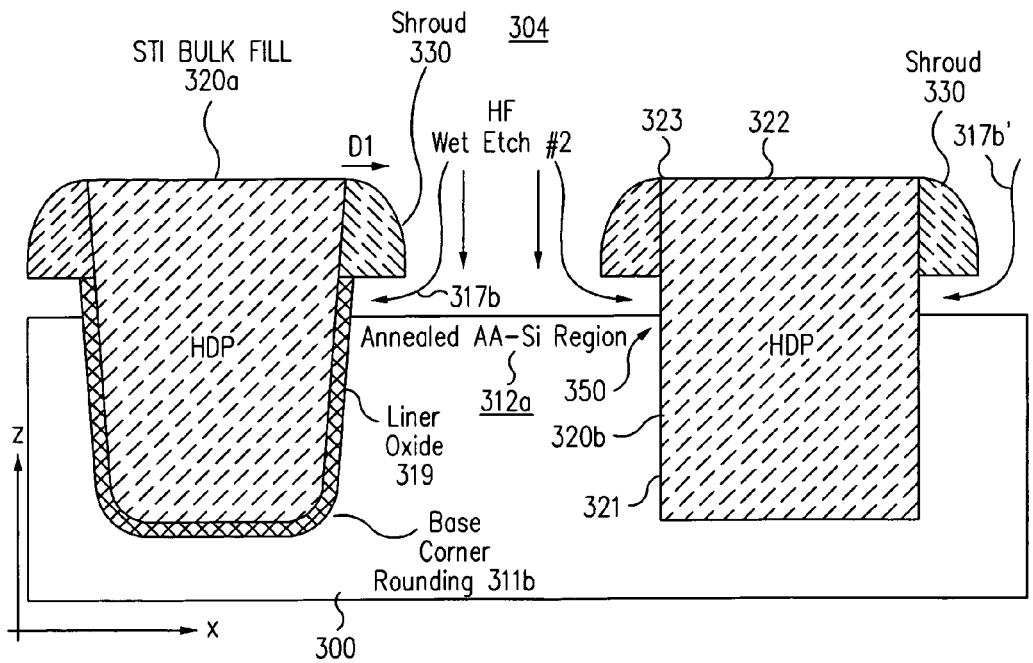
FIG. 3C is a schematic cross sectional view of a state in the fabrication of the STI structure in accordance with the disclosure showing how the isotropic etch is controlled by the etch-resistant shrouds so as to prevent or reduce the formation of the undesirable crevice in the STI sidewall fence.

The ARC layer 360 has a first thickness (in-well thickness) H3$a$ which is less than the magnitude of a sidewall-adjacent thickness H4 (i.e., H3$a$<H4). A subsequent, ARC etchback step 302 removes the in-well thickness H3$a$ while leaving residue behind to thereby form corner-protecting shrouds 330 (FIGS. 3B and 3C). More specifically, in one embodiment of the structure shown in FIG. 3A, the thickness H3$a$ of the in-well ARC and the thickness H3$b$ of the on-fill ARC is about 1,300 Å and the thickness H4 of the sidewall-adjacent ARC is about 2,000 Å. The trench fill step height H2 is between about 700 Å and about 800 Å in this embodiment.

In preparing for spin-on coating of the ARC or other shroud material, one or more of the puddling time, spin speed, fluid composition, fluid temperature, and amount of material deposited at the center of the wafer may be adjusted so that the ARC layer 360 will conformably coat to the nonplanar surface of the wafer. Rises of height H4 should occur at least in the vicinities W3$c$ of the trench fill sidewalls while depressions with lesser thickness H3$a$ should occur at least in the vicinities W3$a$ (360$a$) of the inter-trench wells.

Aside from assuring that H4>H3$a$, measures should be taken to assure that the amount of ARC-precursor material deposited at the center of the wafer is sufficiently large to uniformly coat the wafer with out leaving open breaks in the trench fill step regions W3$c$. At the same time, the amount of ARC-precursor material deposited at the center of the wafer should be empirically set sufficiently small so that the post-puddle spin-on thickness of the hardened ARC-precursor material (Anti-Reflection Coating material plus solvent) will be approximately the illustrated, H3$a$ and H3$b$ dimensions with a significant rise of height H4 near the trench fill sidewalls. This is to be contrasted with the hypothetical, and much larger H5 dimension needed to provide planarity at the top of the hypothetical PR material 480 (PR not used). The illustration (FIG. 3A) is not to scale. In practice, well height H3$a$ should be substantially larger than step height H2, for example, at least about 20% greater and more preferably at least about 40% to 80% greater. More ideally, height H3$a$ should be about 100% or more, greater than the fill step height H2.

In addition to the above, it is desirable to assure that the shroud-material precursor fluid (e.g., ARC polymers plus linker plus surfactant-type solvents) adheres very well to the surfaces of the sacrificial oxide 318 and the HDP-oxide trench fills (320$a$, 320$b$) so as to securely provide a sealing fillet in the isolation corner region 350. Most ARC precursor fluid formulations come with appropriate constituents for assuring such good surface adhesion. Thus, almost any commercially-available ARC precursor fluid formulation that is designed for conformal coating should work. The typically-submicron widths of the depressions W3$a$ between the trench fills (320$a$, 320$b$) and the widths of the ARC rises W3$b$ above the trench fills typically combine with surface tension effects and viscosity effects during the conformal coating process to cause the ARC material to conformably fill the step height (H2) of the isolation corner 350 while approximately maintaining its general coating thickness H3a, H3b both upstream and downstream of the isolation corner step and while temporarily increasing to greater thicknesses such as H4 and H3c in the transition over the trench fill corners. The various parameters for step height, well width, etc., can vary from one wafer design to the next. It has been observed that ARC coating thickness H3b on top of the trench fills (320a, 320b) is not always the same as ARC coating thickness H3a in the wells between the trench fills. It is desirable to make the angled connection thickness Tc between H3a and H3b sufficiently large so that the ARC fluid in the wells (W3a) will not break off and separate from the ARC fluid on top of rises (W3b) during the solvent evaporation process.

Although a one-step coating process has been described above for the ARC layer 360, it is within the contemplation of the disclosure to form the hardened ARC layer by repeated fluid deposition and hardening steps. In other words, separate thin layers of ARC material may be each spun-on and individually hardened before the next thin film is spun on. Isolated bubbles of hardened ARC material may be allowed to first form in respective regions W3a and W3b, and thereafter one or more connecting fluids may be applied and successively hardened to fill transition regions W3c. Methods other than spin-on coating may also be used. By way of example, the shroud protecting material may be anisotropically sputter coated onto the sacrificial oxide 318 and trench fills 320a and 320b.

It is to be emphasized that neither spin-on coating nor use of ARC fluid are essential to the formation of the wet-etch-resistant shrouds shown in FIGS. 3B or 3C. Other deposition methods and/or other materials may be used, such as for example, chemical vapor deposition of other organic masking materials. It is sufficient that post-deposition height H4 in the sidewall-adjacent region W3c is greater than the in-well depth H3a in the illustrated in-well region W3a. Anisotropic etching down through the H3a depth will leave shrouding material in sidewall-adjacent region W3c.

Referring again to FIG. 3A, an anisotropic etch 302 follows hardening of the ARC material or curing of another material which forms conformal ARC layer 360. The etch step 302 is used to subtract at least the H3a thickness of the formed layer 360 and to thereby expose the sacrificial oxide 318 in the wells 360a for isotropic (e.g., wet etch) removal. It may be appreciated that this etch step 302 can produce the protective shrouds of FIGS. 3B and 3C when film thickness H4 in the illustrated transition region W3c is greater than film thickness H3a in the illustrated depression region W3a and when the corner ARC thickness Tc is substantially greater than zero. The etch process may be continued beyond that state so as to further adjust a shroud line width D1 (FIG. 3B) as may be desired.

ARC layer 360 is subsequently etched to form shrouds adjacent and aligned to the bulk oxide fills and oxide layer 318. Because of the ability of dry etch processes to etch anisotropically (in comparison to wet etch processes, which etch isotropically), dry etching is preferably used in shroud formation. There are three types of dry etch processes: those that have a physical basis (e.g., ion beam milling), those that have a chemical basis (e.g., non-plasma assisted chemical etching), and those that combine both physical and chemical mechanisms (e.g., reactive ion etching and some types of plasma-assisted etching). Primarily physical dry etch methods may not exhibit sufficient selectivity of the superjacent layer over the underlying layer causing punchthrough of the underlying layer. On the other hand, primarily chemical processes typically etch isotropically and therefore do not form vertical sidewalls. Consequently, chemically enhanced ion etching processes that combine the two mechanisms are preferred. Accordingly, in one embodiment, the method of the present invention utilizes a dry etch involving simultaneous ion bombardment and polymerizing chemistry to etch ARC layer 360.

In one embodiment, an ARC etch plasma recipe was used which included the input into the plasma etch tool of a 60 sccm gas mixture of $O_2$ and $Cl_2$ where the $O_2$ portion defined approximately 25% to 35% of the total volumetric flowrate of the 60 sccm gas mixture. The wafer bias power in this embodiment was in the range of about 50 to 85 Watts. The etch process showed good selectivity for desired removal of the hardened ARC material relative to undesired removal of the surrounding oxides and good uniformity across test wafers. The following Table 1 summarizes one set of experimental results.

TABLE 1

30% $O_2$ Flow With 67.5 Watts of Bias Power

| Material Being Etched by $O_2/Cl_2$ Plasma | Etch Rate (Å/minute) | Uniformity Deviance % (1σ) | Selectivity for Removing ARC |
|---|---|---|---|
| ARC | 2754.8 | 0.33 | N/A |
| HDP-Oxide | 135.1 | 2.52 | 20:1 |
| Silicon Nitride | 42.6 | 13.76 | 64:1 |
| Photo Resist | 1345.0 | 3.76 | 2:1 |

Polymer formation plays an important role in slowing the dry etch rate and allowing for greater selectivity. The etch of ARC using oxygen and chlorine plasma produces a polymer deposition of the form $C_pCl_q$ on the etched surface that acts to passivate the surface and thereby reduces the dry etch removal rate. The key reaction for breaking down the ARC material via the $O_2+Cl_2$ plasma is believed to be as follows:

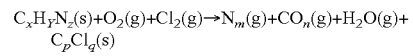

$$C_xH_yN_z(s)+O_2(g)+Cl_2(g) \rightarrow N_m(g)+CO_n(g)+H_2O(g)+C_pCl_q(s)$$

The bombardment of ions from the plasma, in conjunction with the diffusion of chemically reactive species from the plasma to the overlying topography for polymer deposition allows the ARC coating to be etched in a highly directional manner but with selectivity to oxide. The input oxygen generates gaseous carbon monoxide plus water vapor. The input chlorine generates small particles of chlorocarbon polymer which deposits on sidewalls for protection against lateral etching or undercut. The oxygen to chlorine ratio in the plasma may be tailored to provide a maximal removal rate for the ARC formulation being used. This same oxygen to chlorine ratio may be further fine tuned to provide for the desired line width D1. The etch recipe for the experiments of Table 1 were characterized by 30% $O_2$ volumetric content in a 60 sccm input flow of $O_2+Cl_2$ where the bias power was about 67.5 Watts, pressure was about 6–10 milliTorr and run time was about 30 seconds, where endpoint was monitored and detected by spectral analysis using a 90%–95% peak value threshold for the $CO_n$ species at 520 nm wavelength.

It may be observed from Table 1 that the $O_2/Cl_2$ plasma exhibited high selectivity for removing cured ARC material as compared to removing HDP-oxide with a calculated selectivity ratio of approximately 20:1. Accordingly, the $O_2/Cl_2$ plasma does not damage exposed HDP-oxide. A roughly 30 second run of plasma etch can remove about 1,370 Å of hardened ARC material while a mere 70 Å of exposed HDP oxide will be lost if there is such exposed HDP oxide during the entire 30 seconds.

It may be further observed from Table 1 that the $O_2/Cl_2$ plasma is yet even more selective for ARC if the surrounding oxide surfaces are protected by a silicon nitride overcoat. $Si_3N_4$ may therefore be used as an effective etch barrier against the $O_2+Cl_2$ plasma in locations where etch erosion has to be minimized. Hardened photoresist material tends to be very similar in composition to hardened ARC. Yet even there, the $O_2+Cl_2$ plasma may be tailored to provide some degree of selectivity (a 2:1 ratio) for preferentially removing ARC as opposed to PR. Accordingly, a twice as thick or thicker layer of patterned PR may be used to selectively protect desired parts of the ARC-coated wafer as the $O_2+Cl_2$ plasma is being used to form shrouds in unprotected or uncovered parts of the wafer.

It may be further observed from Table 1 that the $O_2/Cl_2$ plasma provided excellent uniformity for removal of ARC across the diameters of each of the test wafers. Accordingly, the $O_2/Cl_2$ plasma is well suited for providing uniform mass-production results. The less uniform effect on cross-wafer HDP removal can be neglected because of the low etch rate for oxide.

The effects from the above described mechanisms, involving either the physical bombardment component or the chemical polymer deposition component, can be magnified or reduced to form ARC shrouds with desired profiles, high uniformity, and high selectivity. The plasma composition between $O_2$ and $Cl_2$ and the bias power during etch may be adjusted for tailoring the shroud profile and etch selectivity to thereby protect the underlying silicon substrate and trench isolation dielectric. In particular, shroud line width D1 should be sufficiently tailored to be equal to, or slightly greater than the H1 depth of the sacrificial oxide 318 as may be appropriate for a given application.

In one embodiment, the etch step 302 is terminated by an end-point detection system which optically detects the opening of the bottom wells 360a of height H3a. This optical system takes advantage of the fact that ARC layer 360 is optically absorbing while the silicon 321a underneath the transparent sacrificial oxide 318 is reflective. Thus, when the etch process breaks through the ARC in the wells, this may be signaled by the shift in reflectance. In other embodiments as mentioned above, spectral analysis of certain reaction species may be used for signaling endpoint. The ARC etch plasma is turned off shortly thereafter and part of the sidewall-adjacent ARC is left behind to form the shrouds 330 as shown in FIGS. 3B and 3C.

When the etchback 302 is terminated at the appropriate time, an etch-resistant fillet is left behind which shrouds the isolation corner as illustrated in FIG. 3B. Subsequently, the sacrificial oxide layer can be isotropically removed without formation of detrimental sidewall crevices in the trench isolation dielectric.

FIG. 3B schematically shows a cross sectional view of a state 303 in the fabrication of a monolithically integrated STI structure in accordance with the present disclosure. More specifically, FIG. 3B shows the start of an isotropic wet etch of sacrificial oxide layer 318 after formation of shrouds 330. Etch-resistant shrouds 330 have been uniformly provided in isolation corner portions 350 of each wafer (and also on a consistent basis from mass-production wafer to wafer) so as to protect the isolation corners 350 from attack by a pre-specified etchant 317 (e.g., a diluted 100:1 HF solution).

The shrouds extend vertically up to or substantially near the top fill corners 323 so as to protect at least one wall forming the top fill corners 323 from attack by the pre-defined isotropic etchant 317. As seen in state 304 of FIG. 3C, the D1 line width (e.g., the bottom width of the shrouds) has protected the isolation trench fill sidewalls in corners 350 from substantial damage by etchant 317. The shrouds 330 may also protect the sharpness of the top fill corners 323 from being dulled (rounded) by the etchant 317.

The etch-resistant shrouds 330 may be composed of a relatively solid, organic material, such as for example, one having the general formula $C_xH_yN_z$, where x>0, where x+y+z=1, and where at least one of y and z is also greater than zero. A variety of etch-resistant materials may be used. Different methods for depositing and shaping the etch-resistant material may be used as discussed above. It is generally desirable per the teachings of this disclosure to have an inexpensive and uniform method for depositing the etch-resistant material, and to have a method for uniformly and controllably shaping the shrouds without substantially damaging adjacent structures, and to have a method for removing the shrouds after they have been used to control the flow of the isotropic etch (317) as shall now be explained. The controllable shaping of the shrouds includes controlling the shroud line width D1, the function of which will now be explained in further detail.

Each etch-resistant shroud 330 should extend laterally (in the X direction) at the bottom portion of the shroud at substantially vertical and respective sidewall 321 of its corresponding trench fill (320a or 320b). Pre-specified line width D1 should be made sufficiently large so as to delay the pre-specified isotropic etchant 317 (e.g., a diluted wet HF solution) from eating its way laterally (X-direction) through the sacrificial oxide 318 and thereby moving under the bottom of the shroud to thereby reach the vertical and respective sidewall 321 of its corresponding trench fill (e.g., HDP oxide) before a substantial portion of the vertical thickness (H1) of the sacrificial oxide has also been vertically eaten away (in the Z-direction) by the etchant 317. D1 should not be so large as to block the etchant 317 from clearing away the sacrificial oxide under the shroud. Stated otherwise, the D1 distance is used to prevent the etchant 317 from creating substantial sidewall grooving in the trench fill oxide 320a–320b before the etchant 317 has had a chance to remove essentially all of the H1 vertical thickness of the sacrificial oxide layer 318. Since H1 can vary, it is desirable to be able to fine tune the magnitude of the D1 distance.

More specifically, the isotropic etching process 317 that takes place in FIG. 3B may be viewed as having two or more subprocesses. A first, 317a of the sub-processes is etching its way vertically (in the Z direction) through the H1 thickness of the sacrificial oxide layer 318 at a predetermined first rate. A second, 317b of the subprocesses is etching its way laterally (in the X direction) under the bottom of the shroud and through the D1 line width distance of the sacrificial oxide layer 318, towards the isolation corner 350, typically at the same etch rate as the predetermined first rate.

If the first distance, D1, is made approximately equal to or greater than the thickness dimension, H1, of the sacrificial oxide, then the pre-specified isotropic etchant 317 will essentially remove the sacrificial oxide layer 318 before the second etch subprocess, 317b, has had an opportunity to substantially erode into the sidewall 321 of the trench fill (320a). Thus, with the D1 distance appropriately set, the trench fill sidewall 321 can be protected from being significantly eroded away by the pre-specified etchant 317 (e.g., a diluted wet HF solution) at the same time that the etchant 317 is essentially removing the sacrificial oxide layer 318.

It is understood that the etch subprocesses, 317a–317b, should be timely halted by, for example, using an appropriate rinse (e.g., deionized water) once sufficient time has passed for the first etch subprocess 317a to essentially remove the sacrificial oxide 318. A lesser or greater amount of time may be allowed to elapse prior to the stopping of the isotropic etch 317 if other results are desired. Etch subprocess 317b' is shown on the right side of FIG. 3B as having already progressed by a given amount and as having already partially eaten its way under shroud 330.

FIG. 3C schematically shows a cross sectional view of a state 304 in the fabrication of the monolithically integrated STI structure 300. More specifically, FIG. 3C shows the end of the isotropic etch of the sacrificial oxide layer 318. In state 304, the etch-resistant shrouds 330 have protected the trench fill sidewalls 321 from being substantially damaged by the isotropic etch process which removed the sacrificial oxide 318. The annealed AA silicon region 312a is now exposed and ready to be thermally oxidized to create the gate oxide layer (e.g., GOX 130 of FIG. 1A) without forming thermal oxide in a crevice (see briefly 212d of FIG. 2C for comparison).

Figure 3D:
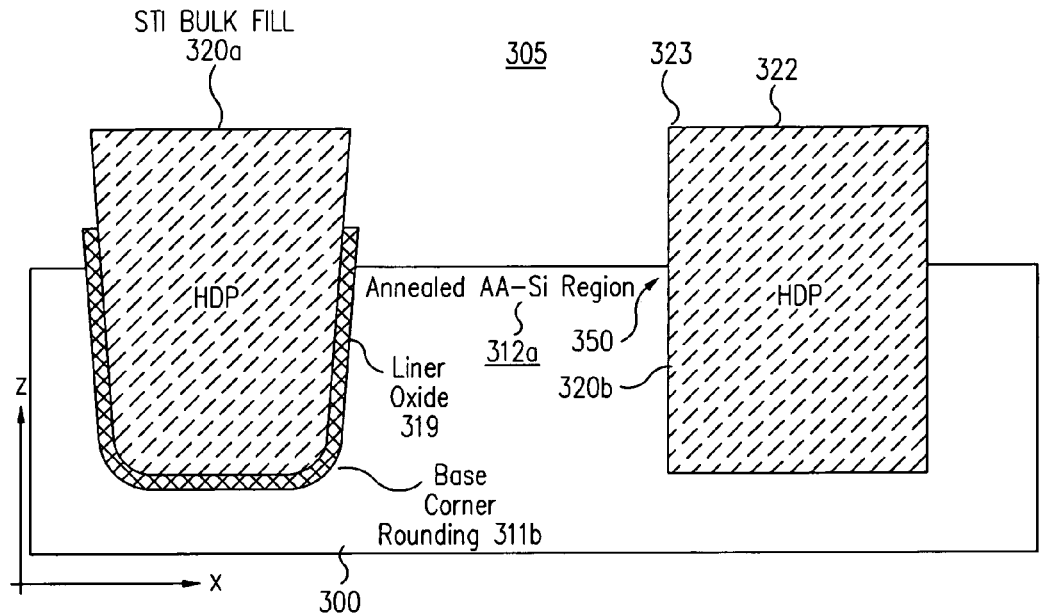
FIG. 3D is a schematic cross sectional view of a state in the fabrication of the STI structure in accordance with the disclosure in which the etch-resistant shrouds have been removed.

FIG. 3D shows a cross sectional view of a state 305 in the fabrication of the monolithically integrated STI structure 300 after the shrouds have been removed. The growth atmosphere for the thermally-grown gate oxide may be simultaneously used for ashing away the protective shrouds 330. Alternatively, the protective shrouds 330 may be selectively removed even before the isotropic etch process 317 has completed removal of the sacrificial oxide 318.

Figure 3E:
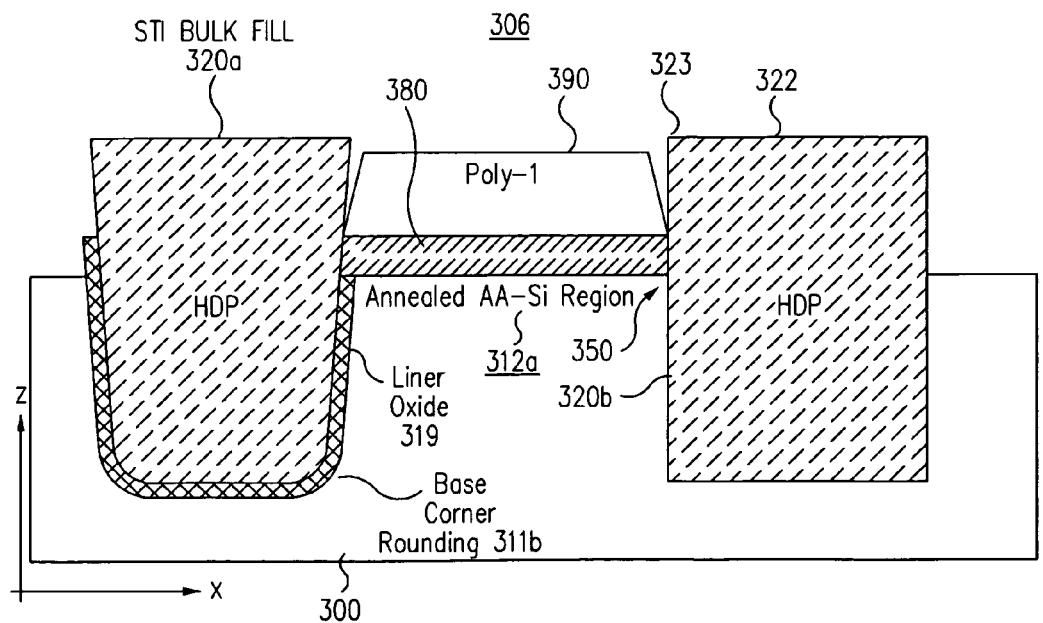
FIG. 3E is a schematic cross sectional view of a state in the fabrication of the STI structure, showing formation of the gate oxide and the gate electrode without grooving.

FIG. 3E shows a cross sectional view of a state 306 in the fabrication of the monolithically integrated STI structure 300 after formation of the gate oxide 380 and the gate electrode 390 over the gate oxide.

Figure 4:
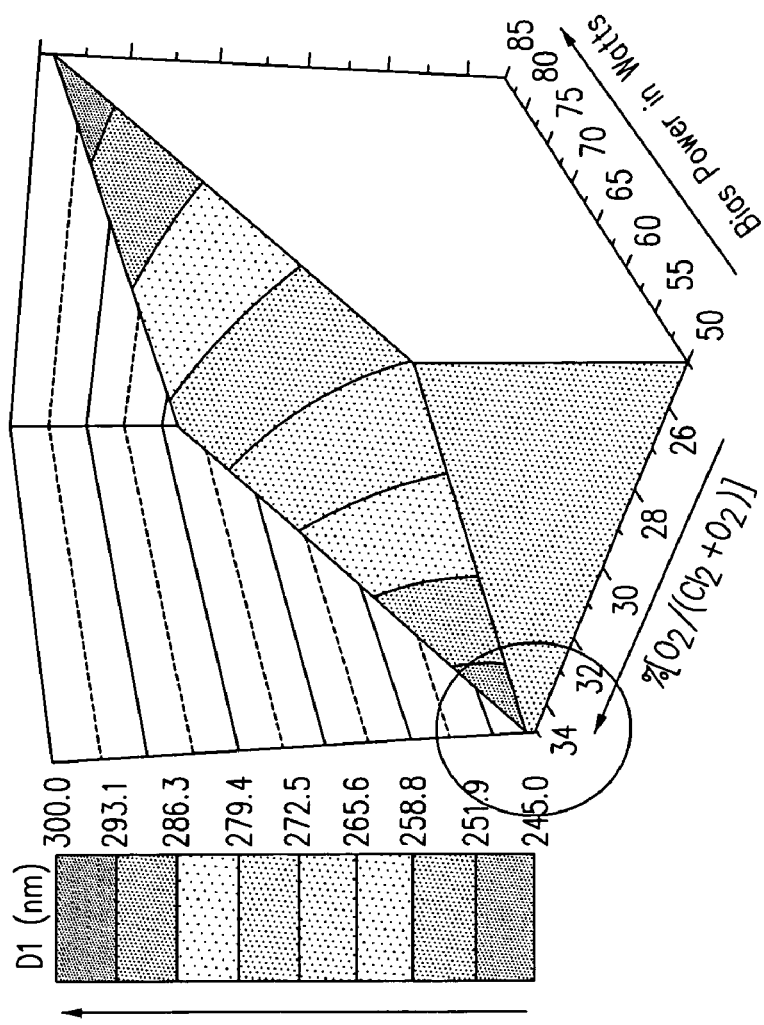
FIG. 4 is a three-dimensional process control graph showing how a D1 line width of the shrouds may be controlled with either one or both of etchback plasma composition and plasma bias power.

FIG. 4 is a 3-dimesional plot showing the results of one, range-of-control experiment carried out with 1300 Å ARC conformably deposited on 700 Å trench fill steps, and where sacrificial oxide thickness (H1) is expected to be about 275 nm (2750 Å). It was found that either or both of percent oxygen in the 60 sccm inflow and reactor bias power could be used to control the D1 line width almost linearly in the range where D1 is between 245 nm to 300 nm, and percent oxygen is between 26% to 34% and bias power is between 50 Watts to 85 Watts. FIG. 4 shows that for each desired magnitude of D1 between 245 nm and 300 nm there are subranges of %O$_2$ and bias power which will produce the desired magnitude of D1. Thus, process designers may choose an appropriate combination of %O$_2$ and bias power for a desired D1, in view of possible other mass-production constraints.

By way of a further example, it is understood that the configuring of an etchback tool to provide a desired D1 dimension in response to a pre-fixed or measured H1 value (thickness of the sacrificial oxide) and/or in response to a pre-fixed or measured H3a,b,c value (thicknesses of the cured ARC material 360) may be automated. An etchback tool or process (302) in accordance with the present disclosure may therefore include the use of a computer to carry out the automatic setting of %O$_2$ and bias power to realize a computer-determined or otherwise specified D1 dimension. A computer-readable medium or another form of a software product or machine-instructing means (including but not limited to, a hard disk, a compact disk, a flash memory stick, a downloading of manufactured instructing signals over a network and/or like software products) may be used for instructing an instructable machine (e.g., a plasma etch tool) to carry out such automated activities. As such, it is within the scope of the disclosure to have an instructable machine carry out, and/or to provide a software product adapted for causing an instructable plasma etch machine to carry out the disclosed etch step 302. It is also within the scope of the disclosure to have an instructable machine carry out, and/or to provide a software product adapted for causing an instructable spin-on coating tool to adjust viscosity and/or other characteristics of an ARC or other spin-on shroud material so that desired quasi-conformal coating will be realized in accordance with FIG. 3A.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations. Given the above disclosure of general concepts and specific embodiments, the scope of protection sought is to be defined by the claims appended hereto.

What is claimed is:

1. A method of manufacturing a semiconductor device, comprising:
   providing a silicon oxide layer over a substrate;
   providing a trench in the substrate, an intersection of the trench and the surface of the substrate forming a corner;
   providing a dielectric that fills the trench to a level above the silicon oxide layer;
   providing an anti-reflective coating (ARC) layer conformally over the dielectric and the silicon oxide layer; and
   etching the ARC layer with a plasma including O$_2$ and Cl$_2$ to form an ARC shroud aligned with a sidewall of the dielectric, the ARC shroud protecting the dielectric from loss proximate the corner during a subsequent wet etch.

2. The method of claim 1, wherein the silicon oxide layer has a thickness between about 100 Å and about 300 Å.

3. The method of claim 1, wherein the silicon oxide layer is thermally grown by oxidizing monocrystalline silicon.

4. The method of claim 1, wherein the dielectric is provided by high density plasma chemical vapor deposition.

5. The method of claim 1, wherein a top surface of the dielectric is between about 700 Å and about 800 Å above a top surface of the silicon oxide layer.

6. The method of claim 1, wherein the ARC layer has a thickness between about 1,200 Å and about 1,400 Å above the silicon oxide layer.

7. The method of claim 1, wherein the ARC layer has a thickness between about 1,200 Å and about 1,400 Å above the dielectric.

8. The method of claim 1, wherein the ARC layer is comprised of an organic compound having the formula C$_x$H$_y$N$_z$, where x is greater than zero and at least one of y and z is greater than zero.

9. The method of claim 1, wherein the volumetric percentage of O$_2$ in the plasma is in the range of about 25% to about 35%.

10. The method of claim 1, wherein the substrate is biased with a bias power in the range of about 50 Watts to about 85 Watts.

11. The method of claim 1, further comprising:
removing the silicon oxide layer with a wet etchant;
removing the ARC shroud;
providing a gate oxide over the substrate; and
providing a gate electrode over the gate oxide.

12. The method of claim 11, wherein the ARC shroud is removed by an oxygen plasma.

13. The method of claim 1, wherein the ARC shroud includes a width adjacent the silicon oxide layer.

14. The method of claim 13, wherein the width is at least as wide as a thickness of the silicon oxide layer.

15. A method of manufacturing a semiconductor device, comprising:
providing a silicon oxide layer over a substrate;
providing a trench in the substrate, an intersection of the trench and the surface of the substrate forming a corner;
providing a dielectric that fills the trench to a level above the silicon oxide layer;
providing an anti-reflective coating (ARC) layer conformally over the dielectric and the silicon oxide layer;
etching the ARC layer with a plasma including $O_2$ and $Cl_2$ to form an ARC shroud aligned with a sidewall of the dielectric and a portion of the silicon oxide layer;
etching the silicon oxide layer with a wet etchant, the ARC shroud protecting the dielectric from loss proximate the corner during the wet etch;
removing the ARC shroud;
providing a gate oxide substantially over the substrate where the silicon oxide layer was previously provided; and
providing a gate electrode over the gate oxide.

16. The method of claim 15, wherein the silicon oxide layer is thermally grown by oxidizing monocrystalline silicon.

17. The method of claim 15, wherein the dielectric is provided by high density plasma chemical vapor deposition.

18. The method of claim 15, wherein a top surface of the dielectric is between about 700 Å and about 800 Å above a top surface of the silicon oxide layer.

19. The method of claim 15, wherein the ARC layer has a thickness between about 1,200 Å and about 1,400 Å above the silicon oxide layer.

20. The method of claim 15, wherein the ARC layer has a thickness between about 1,200 Å and about 1,400 Å above the dielectric.

21. The method of claim 15, wherein the ARC layer is comprised of an organic compound having the formula $C_xH_yN_z$, where x is greater than zero and at least one of y and z is greater than zero.

22. The method of claim 15, wherein the volumetric percentage of $O_2$ in the plasma is in the range of about 25% to about 35%.

23. The method of claim 15, wherein the substrate is biased with a bias power in the range of about 50 Watts to about 85 Watts.

24. The method of claim 15, wherein the ARC shroud is removed by an oxygen plasma.

25. A method of manufacturing a semiconductor device, comprising:
providing a silicon oxide layer over a substrate;
providing a trench in the substrate, an intersection of the trench and the surface of the substrate forming a corner;
providing a dielectric that fills the trench to a level above the silicon oxide layer;
providing an anti-reflective coating (ARC) layer conformally over the dielectric and the silicon oxide layer; and
etching the ARC layer with a plasma including a preselected ratio of $O_2$ to $Cl_2$ at a preselected bias power to form an ARC shroud aligned with a sidewall of the dielectric, the ARC shroud protecting the dielectric from loss proximate the corner during a subsequent wet etch.

26. The method of claim 25, wherein the volumetric percentage of $O_2$ in the plasma is in the range of about 25% to about 35%.

27. The method of claim 25, wherein the substrate is biased with a bias power in the range of about 50 Watts to about 85 Watts.

* * * * *